(12) United States Patent
Zhang

(10) Patent No.: US 8,912,637 B1
(45) Date of Patent: Dec. 16, 2014

(54) SELF-ADHESIVE DIE

(71) Applicant: Texas Instruments Incorporated, Dallas, TX (US)

(72) Inventor: Rongwei Zhang, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/034,078

(22) Filed: Sep. 23, 2013

(51) Int. Cl.
*H01L 21/78* (2006.01)
*H01L 23/495* (2006.01)

(52) U.S. Cl.
CPC .............................. *H01L 23/49582* (2013.01)
USPC ............ 257/676; 257/E23.003; 257/E33.057; 438/106

(58) Field of Classification Search
CPC ............................... H01L 21/78; H01L 23/34
USPC ........................................................ 257/676
See application file for complete search history.

(56) References Cited

U.S. PATENT DOCUMENTS

| 7,727,814 | B2 * | 6/2010 | Suh et al. ....................... 438/119 |
| 7,791,194 | B2 * | 9/2010 | Gektin et al. .................. 257/734 |
| 7,808,089 | B2 | 10/2010 | Nguyen et al. |
| 7,838,974 | B2 | 11/2010 | Poddar et al. |
| 7,859,090 | B2 | 12/2010 | Bayan et al. |
| 8,106,517 | B2 * | 1/2012 | Kabir et al. ................... 257/773 |
| 8,753,924 | B2 * | 6/2014 | Wainerdi et al. .............. 438/122 |

OTHER PUBLICATIONS

Zhang, Ming Liang et al, Preparation of Large-Area Uniform Silicon Nanowires Arrays through Metal-Assisted Chemical Etching, J. Phys. Chem. C, vol. 112, No. 12, 2008, 4444-4450.

Balasundaram, Karthik et al., Porosity control in metal-assisted chemical etching of degenerately doped silicon nanowires, IOP Publishing, 2012 Nanotechnology 23, pp. 7.

(Continued)

*Primary Examiner* — Allen Parker
*Assistant Examiner* — Patricia Reddington
(74) *Attorney, Agent, or Firm* — Steven A. Shaw; Frederick J. Telecky, Jr.

(57) ABSTRACT

A method and apparatus for enhancing the thermal performance of semiconductor packages effectively. The concept of this invention is to provide silicon nanowires on the backside of an integrated circuit die to directly attach the die to the substrate, thereby improving the interface between die and substrate, and thus enhancing thermal performance and enhancing reliability by improving adhesion.

6 Claims, 3 Drawing Sheets

(56) References Cited

OTHER PUBLICATIONS

Qu, Liangti et al., Carbon Nanotube Arrays with Strong Shear Binding-On and Easy Normal Lifting-Off, Science, vol. 322, Oct. 10, 2013, pp. 238-242.

Mimicking Gecko Feet: Dry Adhesive Based on Carbon Nanotubes Gets Stronger, ScienceDaily, Georgia Institute of Technology, Oct. 10, 2008.

Duran, S. et al., Silicon Nanovelcro to Attach Inorganci Microdevices to Biological Material, 14th International Conference on Miniaturized Systems for Chemistry and Life Sciences, Oct. 3-7, 2010, Groningen, The Netherlands, pp. 503-505.

Dubrow, Zoe E., Characterization and Optimization of the Bonding Forces of a Novel Silicon Nanowire Gecko Biomimetic Adhesive, California State Fair, 2010 Project Summary.

Fischer, Kathleen E. et al, Biomimetic nanowire coatings for next generation adhesive drug delivery systems, Nano Lett. Feb. 2009; 9 (2): 716-720.

Shim, Hyun Woo et al., Strong friction of silicon carbide nanowire films, IOP Publishing, Nanotechnology 20 (2009), pp. 4.

Ko, Hyunhyub et al., Wet and Dry Adhesion Properties of Self-Selective Nanowire Connectors, Adv. Funct. Mater. 2009, 19, 3098-3102.

Ko, Hyunhyub et al., Thermoresponsive Chemical Connectors Based on Hybrid Nanowire Forests, Angew. Chem. Int. Ed. 2010, 49, 616-619.

\* cited by examiner

SELF-ADHESIVE DIE

FIELD OF THE INVENTION

The invention described herein relates generally to semiconductor device packaging and associated die attachment methods. In particular, the invention relates to cost effective packaging methods that provide high thermal performance at the interface of die to lead frame when implemented in molded packages. The principles herein are also applicable to other semiconductor packages and devices.

BACKGROUND OF THE INVENTION

The present invention relates generally to the packaging of integrated circuits (ICs). More particularly, a new die attach method suitable for use in packaging IC dice are described to eliminate die attach materials and reduce the cost, while providing good thermal performance and without the concern of resin bleed-out.

There are a number of conventional processes for packaging integrated circuit (IC) dice. By way of example, many IC packages utilize a metallic lead frame. The lead frame typically includes a plurality of leads or contacts, and optionally a die attach pad (paddle) upon which a die may be attached by means of a suitable adhesive material. The die is typically electrically connected to the lead frame leads by appropriate connectors such as bonding wires. In general, the die and portions of the lead frame are encapsulated with a molding material to protect the electrical connections and the delicate electrical components on the active side of the die.

The above-mentioned adhesive material can be in the format of paste (called die attach paste) or film (die attach film). Die attach paste, typically contains about 80 wt % silver filler and about 20 wt % polymer resin and additives. There are many limitations with die attach paste including resin bleed out (RBO), inconsistent die attach thickness, outgassing of organic components onto the bond pad on die surface causing non-stick on pad (NSOP) or causing the corrosion, and so on. Die attach film (DAF) has been developed to address some of the problems such as RBO and inconsistent die attach thickness. However, there are still some problems associated DAF such as limited thermal conductivity, sawing and die pickup issues. Moreover, the cost of DAF material is much higher than die attach paste.

On the other hand, much effort has been focused on gecko-inspired adhesives, which primarily rely on Van der Waals forces for adhesion by growing nanomaterials (such as carbon nanotubes) on the backside of the wafer or the chip. The growth temperature is about 750-850° C. However microelectronic chips cannot withstand so high temperature.

In view of the foregoing, there is continuing effort to produce cost effective packaging methods that provide high thermal performance at the interface of die to lead frame when implemented in molded packages

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In accordance with an embodiment of the present application, an apparatus is provided. The apparatus comprises: a semiconductor die, having a top side and a backside; a plurality of silicon nanowires formed on the backside of the semiconductor die; a substrate, having a top side with a die attach pad and a backside; wherein the backside of integrated circuit die is positioned on the die attach pad while maintaining the top surface of the die in a parallel with the top surface of the substrate; and wherein the semiconductor die is mechanically attached to the substrate by the silicon nanowires using pressure between 0.01 Megapascal MPa) and 1 MPa.

In accordance with another embodiment of the present application, a method of attaching a semiconductor die to a substrate is provided. The method comprising the steps; providing a semiconductor wafer containing integrated circuits, wherein the wafer has a top side and a backside; printing an ink containing metal nanoparticles of the back side of the wafer; etching a plurality of cavities on the backside of the wafers using metal assisted chemical etching to form a plurality of silicon nanowires; separating the semiconductor wafer into individual integrated circuit die; providing a substrate, having a top side with a die attach pad, and a backside; positioning the backside of integrated circuit die on the die attach pad while maintaining the top surface of the die in a parallel with the top surface of the substrate; and attaching the integrated circuit die to the substrate by the silicon nanowires using pressure between 0.01 and 1 MPa.

DESCRIPTION OF THE VIEWS OF THE DRAWING

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present invention relates generally to the packaging of integrated circuits. As explained in the background section, the testing and operation of an integrated circuit (IC) package may subject the package to temperature extremes and other stresses. Such stresses may cause delamination and degrade the thermal performance of the package. The present invention provides a simple, cost-effective approach for die attached to lead frame surface.

Figure 1:
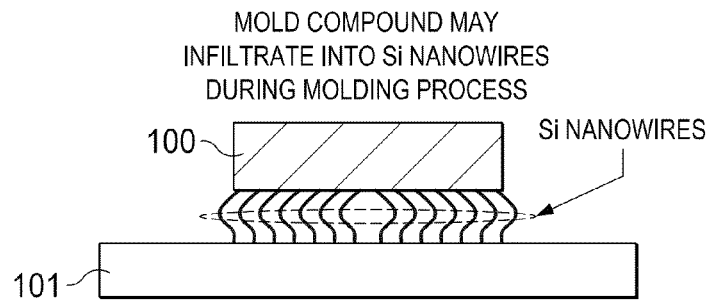
FIG. 1 is sectional view, including an expanded view of area of interest of a die mounted integrated circuit in according with an embodiment of this invention.

Referring next to FIG. 1, an improved packaging structure design in accordance with one aspect of the invention will be described. FIG. 1 illustrates a cross-sectional view of one embodiment of the present invention where a die 100 is secured to the die attach pad 101 with Silicon nanowires. The nanowires are between the 10 nm and 1 um in diameter and 0.1-20 um long and adhere the bottom of the die to the top surface of the die attach pad. The bottom surface of the die 100 includes a plurality of silicon nanowires.

The bond between the die pad 101 and the back of the die 100 is obtained by applying pressure to the die/die attach pad combination. Pressure is typically in the range of 0.01-1 Megapascal (MPa). In addition, the silicon nanowire can be modified with Amine-based, sulfur-based and phosphorous-based silane coupling agents to substantially enhance the adhesion between silicon nanowire and lead frame surface.

The die mount procedure mentioned above improves adhesion through increasing the bonding area and possibly forming mechanical interlocking using roughened lead frame, thus enabling enhanced package performance and reliability.

Embodiments of the present invention will now be described with reference to FIGS. 2-6. A particular embodiment of the regions pertaining to the die 100, silicon nanowires, die attach pad 101 will be described.

Figure 2:
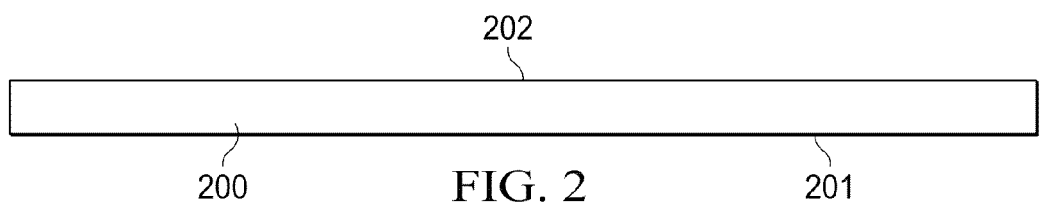
FIG. 2 through FIG. 4 are illustrations of steps in the fabrication of a wafer formed according to an embodiment of this invention.

FIG. 2 is an exemplary sample of a semiconductor wafer 200 having top 201 and backside 202 surfaces.

Figure 3:
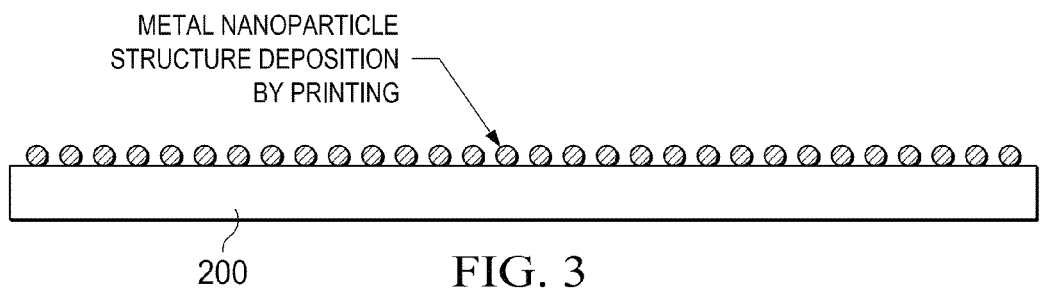

FIG. 3 illustrates application of metal nanoparticles to the backside of the wafer 200. Application can be accomplished in a variety of methods. In this particular embodiment, the particles are applied by printing the backside of the wafer with an ink containing metal nanoparticles. The metal nanoparticles can be Platinum (Pt), Gold (Au) or Silver (Ag). The ink is then dried to evaporate the volatile suspension vehicle.

Figure 4:
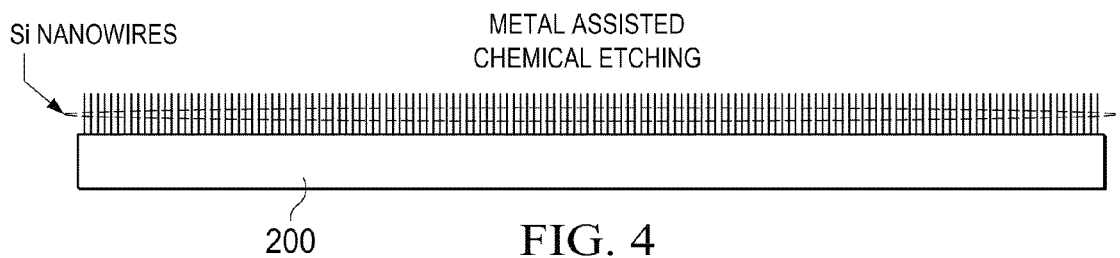

FIG. 4 shows the backside of the wafer after silicon nanowires, are formed utilizing Metal-assisted Chemical Etching to form the nanowires.

Figure 5A:
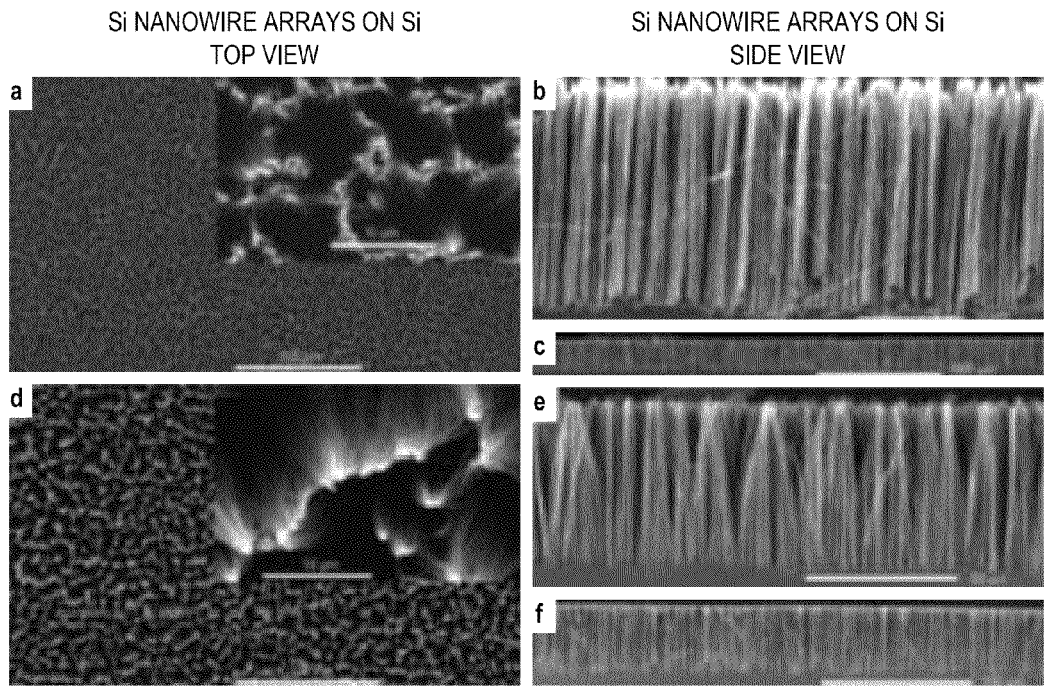
FIG. 5A is a scanning electron microscope (SEM) photo of Si nanowire arrays on Si.
Figure 5B:
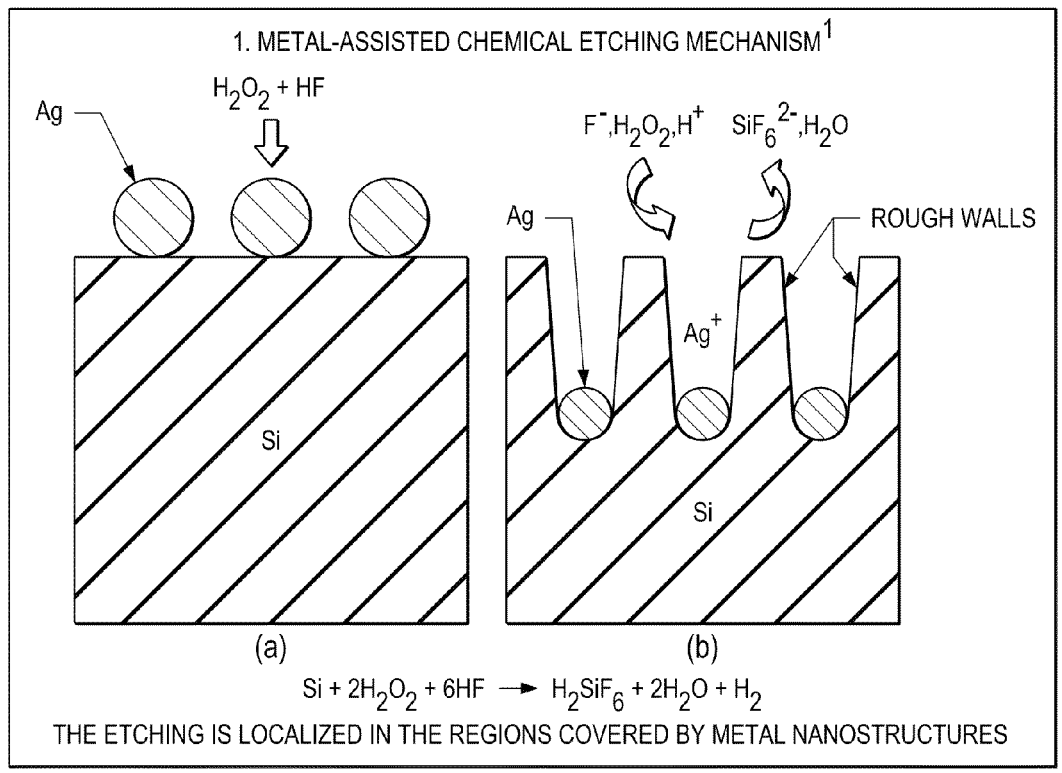
FIG. 5B is an illustration of the metal-assisted chemical etching of localized regions in a silicon wafer.

FIG. 5B is a diagrammatic illustration of the Metal-Assisted Chemical Etching process. In this particular embodiment, the etching is accomplished using the chemical reaction:

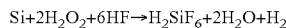

$$Si + 2H_2O_2 + 6HF \rightarrow H_2SiF_6 + 2H_2O + H_2$$

As shown in the illustration in FIG. 5B, where a metal catalyst and a semiconductor interface form a cathode and anode, respectively. Through the metal catalyst, charge injection is sustained from a solution to the substrate and charge is balanced by the cathodic and anodic reactions. The presence of a local site for reaction the metal nanoparticle defines the selectivity of the etching mechanism.

FIG. 5A shows a SEM photo of typical arrays of silicon nanowire arrays formed using the Metal-Assisted Chemical Etching process.

Figure 6:
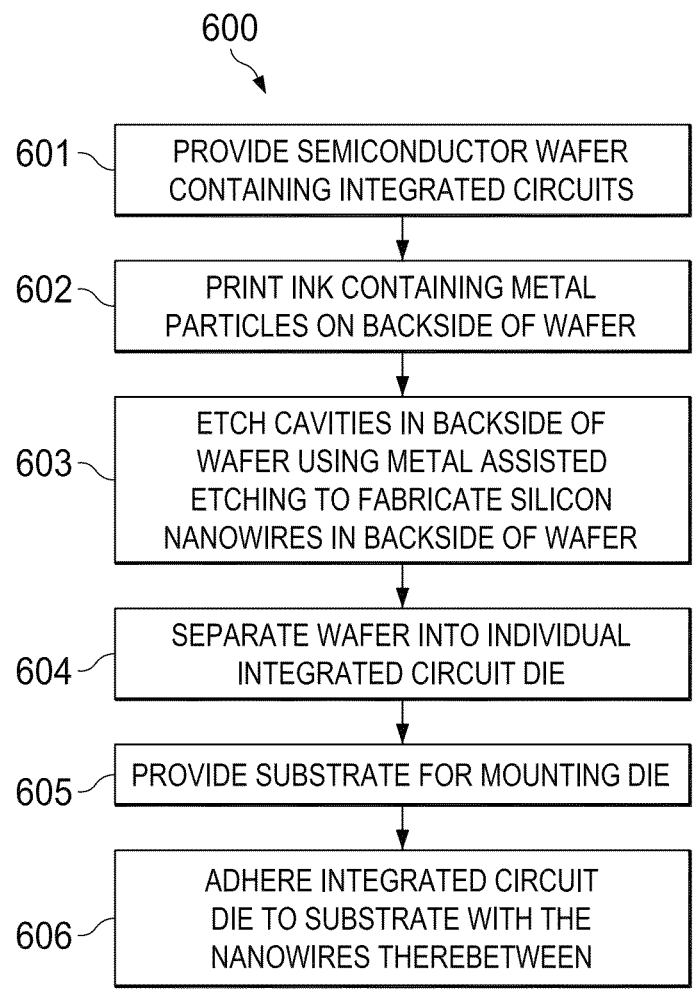
FIG. 6 is a flow diagram of the process used to mount a die according to an embodiment of this invention.

Referring next to the flow chart 600 presented in FIG. 6, one suitable approach for forming a package having good electrical and thermal performance and low delamination at the die-die attach pad interface will be described. Unless explicitly indicated otherwise, the operations described below may be performed concurrently or in any order. Operations may be added to or removed from flow chart 600.

Step 601 involves providing a semiconductor wafer containing integrated circuit die, having a top side and a bottom side.

Step 602 involves depositing metal nanoparticles on the backside of the semiconductor wafer utilizing a printing process wherein the printing process prints ink containg metal nanoparticles on the wafer. The ink is then dried to allow the suspension vehicle in the ink to evaporate leaving the metal nanoparticles on the backside of the wafer.

Step 603 involves etching cavities in backside of wafer using metal assisted chemical etching to form nanowires in the backside of wafer. The cavities formed in the backside of the wafer are typically less than 20 um deep.

Step 604 involves separating the integrated circuit die using a method selected from sawing, scribing and breaking or laser cutting.

Step 605 involves providing a substrate for mounting the die. The substrate can be a lead frame, a laminate or a ceramic package.

Step 606 involves adhering the backside of integrated circuit die to the top surface of the substrate with the nanowires therebetween. Adhering the backside of the integrated circuit die to the top surface of the substrate is accomplished by the physical phenomenon called the Van der Waals Force or chemical interaction if coupling agents are used. The Van der Waals Force is the sum of the attractive or repulsive forces between molecules (or between parts of the same molecule) other than those due to covalent bonds, the hydrogen bonds, or the electrostatic interaction of ions with one another or with neutral molecules or charge molecules. Since the backside of the die has a plurality of silicon nanowires, intimate contact is achieved with the substrate, which leads to the Van der Waals interaction. The interaction with each silicon nanowire is small, however, since the total number of silicon nanowires is large, the total Van der Waals force is large enough to cause excellent self adhesion of the die to the substrate. Better adhesion can be further achieved with substrates through chemical modification of silicone nanowire surface with silane coupling agents or having a rough top surface contact area of a substrate such as roughened lead frame. Since there is no interface between die and silicon nanowires, the thermal performance will be effectively improved.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of attaching a semiconductor die to a substrate, comprising the steps;
   providing a semiconductor wafer containing integrated circuits, wherein the wafer has a top side and a backside;
   printing an ink containing metal nanoparticles of the backside of the wafer;
   etching a plurality of cavities on the backside of the wafers using metal assisted etching to form a plurality of silicon nanowires;
   separating the semiconductor wafer into individual integrated circuit die;

providing a substrate, having a top side with a die attach pad, and a backside;

positioning the backside of integrated circuit die on the die attach pad while maintaining the top surface of the die in a parallel with the top surface of the substrate; and attaching the integrated circuit die to the substrate by the silicon nanowires using pressure between 0.01 and 1 Megapascal (MPa).

2. The method of claim 1, wherein the metal nanoparticles are selected from the group of Platinum (Pt), Gold (Au) or Silver (Ag).

3. The method of claim 1, wherein the separating the semiconductor wafer into individual integrated circuit die is accomplished by a method selected from sawing, scribing and breaking or laser cutting.

4. The method of claim 1, wherein, the silicon nanowires are between 10 nanometers and 1 micrometer in diameter and less than 20 um long.

5. The method of claim 1, wherein the substrate is selected from the group of a lead frame, a laminate or a ceramic package.

6. The method of claim 1, wherein the attaching the integrated circuit die to the substrate is accomplished by Van der Waals force.

* * * * *